(12) United States Patent
Pfirsch

(10) Patent No.: US 12,396,249 B2
(45) Date of Patent: Aug. 19, 2025

(54) RC IGBT AND METHOD OF PRODUCING AN RC IGBT

(71) Applicant: Infineon Technologies Austria AG, Villach (AT)

(72) Inventor: Frank Dieter Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 346 days.

(21) Appl. No.: 17/557,120

(22) Filed: Dec. 21, 2021

(65) Prior Publication Data

US 2022/0199614 A1 Jun. 23, 2022

(30) Foreign Application Priority Data

Dec. 23, 2020 (DE) .................... 102020134850.9

(51) Int. Cl.
| | |
|---|---|
| *H10D 84/60* | (2025.01) |
| *H01L 21/265* | (2006.01) |
| *H10D 8/00* | (2025.01) |
| *H10D 8/01* | (2025.01) |
| *H10D 12/00* | (2025.01) |
| *H10D 12/01* | (2025.01) |

(52) U.S. Cl.
CPC ..... *H10D 84/617* (2025.01); *H01L 21/26513* (2013.01); *H10D 8/045* (2025.01); *H10D 8/422* (2025.01); *H10D 12/038* (2025.01); *H10D 12/481* (2025.01)

(58) Field of Classification Search
None
See application file for complete search history.

(56) References Cited

U.S. PATENT DOCUMENTS

| | | | |
|---|---|---|---|
| 2012/0043581 | A1 | 2/2012 | Koyama et al. |
| 2014/0070266 | A1* | 3/2014 | Matsudai .............. H01L 29/407 |
| | | | 257/139 |
| 2017/0084611 | A1* | 3/2017 | Iwasaki ............... H01L 29/7397 |
| 2018/0261594 | A1* | 9/2018 | Yamano ............... H01L 27/0664 |
| 2018/0269202 | A1 | 9/2018 | Yamano et al. |
| 2018/0308839 | A1 | 10/2018 | Takahashi |
| 2021/0043581 | A1 | 2/2021 | Lin et al. |

FOREIGN PATENT DOCUMENTS

JP  2009170670 A  *  7/2009

OTHER PUBLICATIONS

Machine Translation of JP2009170670A (Year: 2009).*
Franssila, S. "silicon" in Introduction to Microfabrication. 2nd ed. Chichester, West Sussex, England, John Wiley & Sons, 2010. pp. 35-46. (Year: 2010).*

(Continued)

*Primary Examiner* — Erik T. K. Peterson
*Assistant Examiner* — Christopher A. Schodde
(74) *Attorney, Agent, or Firm* — Murphy, Bilak & Homiller, PLLC

(57) ABSTRACT

An RC IGBT includes an IGBT section and a diode section. At least some of a plurality of diode mesas in the diode section are coupled to the drift region via a second anode region electrically connected to the emitter terminal of the RC IGBT. The second anode region extends deeper along the vertical direction as compared to trenches in the diode section.

18 Claims, 8 Drawing Sheets

(56) References Cited

OTHER PUBLICATIONS

Schultz M. (2019) IGBT-basic know-how</i> (Year: 2019).*
Baliga B. J. (2008) Fundamentals of Power Semiconductor Devices </i>Springer Chapter 6 (Year: 2008).*
Baliga B. J. (2008) Fundamentals of Power Semiconductor Devices </i>Springer Chapter 7 (Year: 2008).*
Baliga B. J. (2008) Fundamentals of Power Semiconductor Devices </i>Springer Chapter 9 (Year: 2008).*
Trivedi M., & Shenai K. (2005) The Electrical Engineering Handbook</i> Academic Press Chapter 7 (Year: 2005).*

* cited by examiner

RC IGBT AND METHOD OF PRODUCING AN RC IGBT

TECHNICAL FIELD

This specification refers to embodiments of an RC IGBT and to embodiments of a method of producing an RC IGBT.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity; during a reverse conducting state, the power semiconductor device conducts a reverse load current. Such devices may be designed such that the forward load current capability (in terms of magnitude) is substantially the same as the reverse load current capability.

A typical device that provides for both forward and reverse load current capability is the reverse conducting (RC) IGBT. Typically, for an RC IGBT, the forward conducting state is controllable, e.g., by providing a corresponding signal to the gate electrodes, and the reverse conducting state is typically not controllable, but, due to one or more diode structures in the RC IGBT, the RC IGBT assumes the reverse conducting state automatically if a reverse voltage is present at the load terminals.

It is, of course, possible to provide a reverse current capability by means of a separate diode; e.g., a diode connected anti-parallel to a regular (not reverse conducting) IGBT.

The embodiments described herein, however, relate to the variant where both the IGBT structure and the diode structures are monolithically integrated within the same chip.

A high degree of controllability of an RC IGBT is desired in order to operate the RC IGBT safely and efficiently.

SUMMARY

According to an embodiment, an RC IGBT comprises an active region with an IGBT section and a diode section; a semiconductor body having a first side and a second side; a first load terminal at the first side and a second load terminal at the second side; a plurality of control trenches and a plurality of source trenches, said pluralities of trenches being arranged in parallel to each other along a first lateral direction and extending into the semiconductor body along a vertical direction, wherein the plurality of source trenches extends into both the IGBT section and the diode section; a plurality of IGBT mesas and a plurality of diode mesas in the semiconductor body, said mesas being laterally confined, along the first lateral direction, by respective two of said pluralities of trenches. Each IGBT mesa comprises: a source region of a first conductivity type electrically connected to the first load terminal, and a body region of a second conductivity type electrically connected to the first load terminal and isolating the source region from another first conductivity type region of the RC IGBT. Each diode mesa comprises: a first anode region of the second conductivity type electrically connected to the first load terminal. The RC IGBT further comprises: in the semiconductor body and at the second side, both a diode emitter region of the first conductivity type that forms a part of the diode section and that exhibits a lateral extension in the first lateral direction amounting to at least 50% of the drift region thickness or to at least 50% of the semiconductor body thickness; and an IGBT emitter region of the second conductivity type that forms a part of the IGBT section and that exhibits a lateral extension in the first lateral direction amounting to at least 70% of the drift region thickness or to at least 70% of the semiconductor body thickness. The RC IGBT further comprises, in the diode section, a second anode region of the second conductivity type electrically connected to the first load terminal. The second anode region extends deeper along the vertical direction as compared to the trenches in the diode section. The second anode region overlaps with the diode emitter region for at least 5% of the horizontal area of the diode emitter region.

According to another embodiment, a method of producing an RC IGBT comprises: providing a semiconductor body having a first side and a second side; forming an active region with an IGBT section and a diode section; forming a first load terminal at the first side and a second load terminal at the second side; forming a plurality of control trenches and a plurality of source trenches, said pluralities of trenches being arranged in parallel to each other along a first lateral direction and extending into the semiconductor body along a vertical direction, wherein the plurality of source trenches extends into both the IGBT section and the diode section; forming a plurality of IGBT mesas and a plurality of diode mesas in the semiconductor body, said mesas being laterally confined, along the first lateral direction, by respective two of said pluralities of trenches. Each IGBT mesa comprises: a source region of a first conductivity type electrically connected to the first load terminal, and a body region of a second conductivity type electrically connected to the first load terminal and isolating the source region from another first conductivity type region of the RC IGBT. Each diode mesa comprises: a first anode region of the second conductivity type electrically connected to the first load terminal. The method further comprises: forming, in the semiconductor body and at the second side, both a diode emitter region of the first conductivity type that forms a part of the diode section and that exhibits a lateral extension in the first lateral direction amounting to at least 50% of the drift region thickness or to at least 50% of the semiconductor body thickness; and an IGBT emitter region of the second conductivity type that forms a part of the IGBT section and that exhibits a lateral extension in the first lateral direction amounting to at least 70% of the drift region thickness or to at least 70% of the semiconductor body thickness. The method further comprises forming, in the diode section, a second anode region of the second conductivity type electrically connected to the first load terminal. The second anode region extends deeper along the vertical direction as compared to the trenches in the diode section. The second anode region overlaps with the diode emitter region for at least 5% of the horizontal area of the diode emitter region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
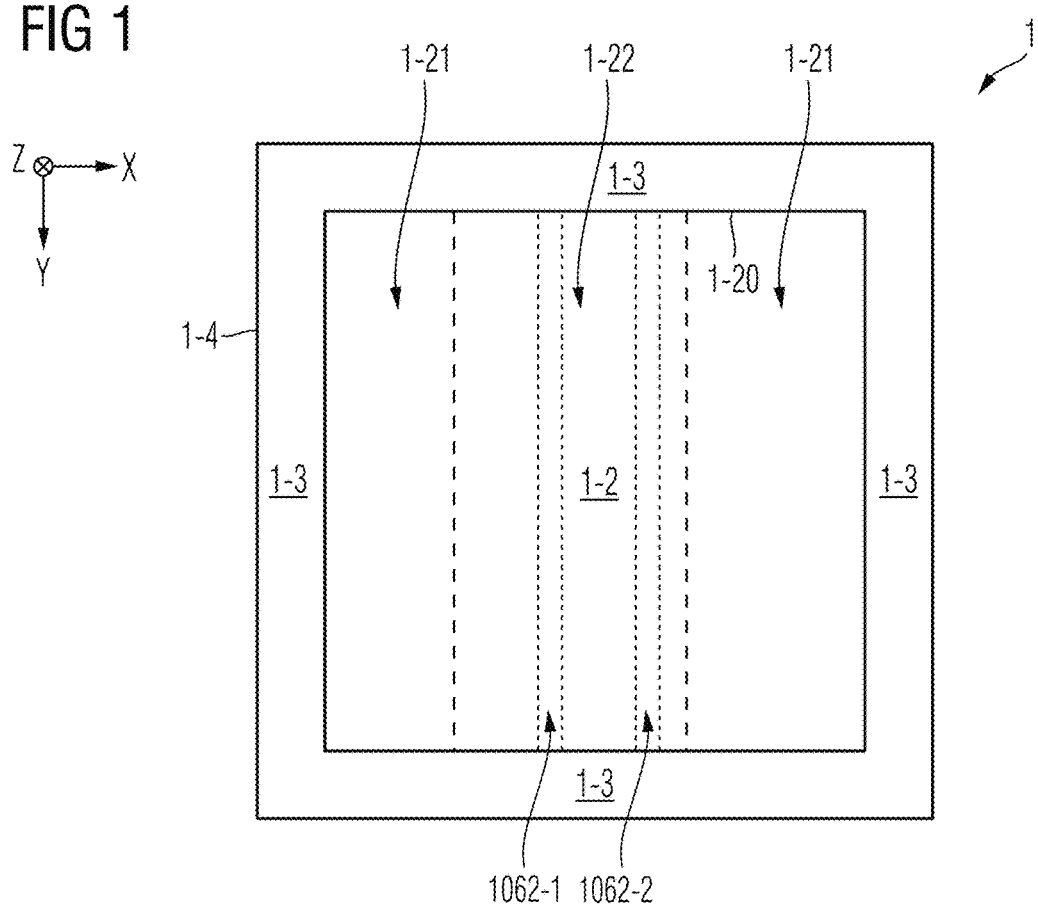
FIG. 1 schematically and exemplarily illustrates a section of a horizontal projection of an RC IGBT in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to an RC IGBT exhibiting a stripe or needle cell configuration, e.g., an RC IGBT to be used within a power converter or a power supply. Thus, in an embodiment, such RC IGBT can be configured to carry a load current that is to be fed to a load and/or, respectively, that is provided by a power source. For example, the RC IGBT may comprise a plurality of power semiconductor cells, such as monolithically integrated diode cells, derivatives of a monolithically integrated diode cell, monolithically integrated IGBT cells and/or derivatives thereof. Such diode/transistor cells may be integrated in a power semiconductor module. A plurality of such cells may constitute a cell field that is arranged within an active region of the RC IGBT.

The term "RC IGBT" as used in this specification intends to describe a power semiconductor device on a single chip with high voltage blocking and/or high current-carrying capabilities. In other words, embodiments of the RC IGBT described herein are single chip power semiconductor devices configured for high current, typically in the Ampere range, e.g., up to several Ampere or up to several ten or hundred Ampere, and/or high voltages, typically 200 V and above, e.g., up to at least 400 V or even more, e.g., up to at least 3 kV, or even up to 10 kV or more.

For example, the RC IGBT described below may be a single chip power semiconductor device exhibiting a stripe cell configuration and configured to be employed as a power component in a low-, medium- and/or high voltage application. Several single chip power RC IGBTs may be integrated in a module so as to form an RC IGBT module, e.g., for installation and use in a low-, medium- and/or high voltage application, such as a major home appliance, a general purpose drive, an electric-drive train, a servo drive, a traction, a (higher) power transmission facilities, etc.

For example, the term "RC IGBT" as used in this specification is not directed to a logic semiconductor device used for, e.g., storing data, computing data and/or other types of semiconductor based data processing.

FIG. 1 schematically and exemplarily illustrates, in a simplified manner, a horizontal projection of an RC IGBT 1 in accordance with one or more embodiments. The RC IGBT 1 can for example be a single chip RC IGBT. Several of such single chip RC IGBTs may be integrated in a power semiconductor module.

For describing the configuration of the RC IGBT 1, it will also be referred to FIGS. 2-4 in the following.

The RC IGBT 1 comprises an active region 1-2 with one or more diode sections 1-22 and one or more IGBT sections 1-21. Both the one or more diode sections 1-22 and the one or more IGBT sections 1-21 are integrated within the same chip of the RC IGBT 1.

An edge termination region 1-3 surrounds the active region 1-2. The edge termination region 1-3 is arranged external of the active region 1-2. The edge termination region 1-3 is laterally terminated by an edge 1-4. The edge 1-4 may form the chip edge of the power semiconductor device 1, e.g., originating from a dicing/sawing processing step.

In an embodiment, the vertical projection of a lateral circumference 1-20 of the active region 1-2 defines the boundary between the active region 1-2 and the edge termination region 1-3.

As used herein, the terms "edge termination region" and "active region" have the respective technical meaning the skilled person typically associates therewith in the context of power semiconductor devices, such as RC IGBTs. That is, the active region 1-2 is primarily configured for forward load current (i.e., "IGBT load current") and reverse load current (i.e., "diode load current") conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

The present specification relates to the configuration of the active region 1-2.

As will be elucidated in more detail below, the RC IGBT 1 can comprise, in the active region 1-2, the IGBT section(s) 1-21 and the diode section(s) 1-22. The different sections 1-21 and 1-22 may be laterally distributed within the active region 1-2, examples of such distribution being described in pending German Patent Applications DE 10 2019 125 007.2 and DE 10 2020 107 277.5.

In an embodiment, the active region 1-2 consists of the diode section(s) 1-22 and the IGBT section(s) 1-21.

In accordance with one or more embodiments described herein, none of the diode sections 1-22 is integrated into the IGBT section 1-21; in other words, in such embodiments, the diode sections 1-22 and the IGBT section 1-21 section are not intermixed with each other. For example, in an embodiment, none of one or more diode sections 1-22 comprises any semiconductor source region (reference numeral 101) of the first conductivity type that is electrically connected to the first load terminal (reference numeral 11) and arranged adjacent to a respective one of the control trenches (reference numeral 14).

For example, the one or more diode sections 1-22 (which are for example not integrated into/intermixed with the IGBT section 1-21 and which are not electrically connected to the first load terminal 11 via source regions 101 of the first conductivity type in an embodiment) form a significant portion of the active region 1-2. Hence, each of the one or more diode sections 1-22 mentioned herein may be a "larger-diode-only" portion of the active region 1-2, in accordance with an embodiment. For example, at least ⅕ or at least ¼ or at least ⅓ of the active region 1-2 may be occupied by the diode section(s) 1-22, and the rest of the active region 1-2 may be occupied by the IGBT section(s) 1-21.

Irrespective of the chosen spatial distribution of the IGBT section 1-21 and diode sections 1-22 within the active region 1-2, it may be ensured that, with respect to a volume of the active region 1-2, the ratio between the total of the IGBT section 1-21 and the total of the diode sections 1-22 is at least 1.5:1, or respectively, at least 2:1, i.e., larger or equal than 2:1. The chosen ratio may depend on the application in which the power semiconductor device 1 is employed. For example, irrespective of the chosen spatial distribution of the IGBT sections 1-21 and diode sections 1-22, it may be ensured that, with respect to a volume of the active region 1-2, the ratio between the IGBT section(s) 1-21 and the diode section(s) 1-22 is even larger than 3:1 or larger than 5:1.

In an embodiment, at least 75% of the total volume of the active region 1-2 may be occupied for forming the IGBT section(s) 1-21, and the remaining 25% (or a lower percentage share) of the active region 1-2 may be employed for forming the diode section(s) 1-22.

Furthermore, there may be one or more transition regions (not-illustrated) arranged between a respective one of the diode section(s) 1-22 and a respective one of the IGBT section(s) 1-21. Each of the one or more transition regions is for example not equipped with a semiconductor source region and exhibits a comparatively low anode emitter efficiency (for example by exhibiting a higher dopant concentration in its portion of the optional barrier region 105 (mentioned further below) as compared to respective portion thereof in the diode section(s) 1-22), in accordance with an embodiment.

If the one or more transition regions is/are provided, the portion occupied thereby is smaller than 20%, smaller than 10% or even smaller than 5% of the total horizontal area of the active region 1-2, in accordance with an embodiment.

In an embodiment, the total horizontal area of the diode sections 1-22 forms a portion of 5% to 40%, or a portion of 15% to 35% of the total horizontal area of both the diode sections 1-22 and the IGBT section 1-21. Said horizontal areas may be determined at a first side 110 of a semiconductor body 10, which may be a frontside.

Furthermore, each of the diode sections 1-22 may have a horizontal area and a circumference defining the horizontal area, wherein each diode section 1-22 obeys the relation that the square of the circumference divided by the area is smaller or equal to 40 or smaller or equal to 30.

In the following, reference will be also be made to "the" diode section 1-22 and "the" IGBT section 1-21. It shall be understood that the explanation provided below with respect to these sections 1-21 and 1-22 may apply to each IGBT section 1-21 or, respectively, each diode section 1-22 that are provided in the active region 1-2. For example, if more than one IGBT section 1-21 is provided, each IGBT section 1-21 may be equally configured (wherein, for example, the IGBT sections 1-21 may differ from each other in total lateral extension or exhibit identical total lateral extensions). Accordingly, if a plurality of diode sections 1-22 is provided, each diode section 1-22 may be equally configured (wherein, for example, the diode sections 1-22 may differ from each other in total lateral extension or exhibit identical total lateral extensions).

Figure 2:
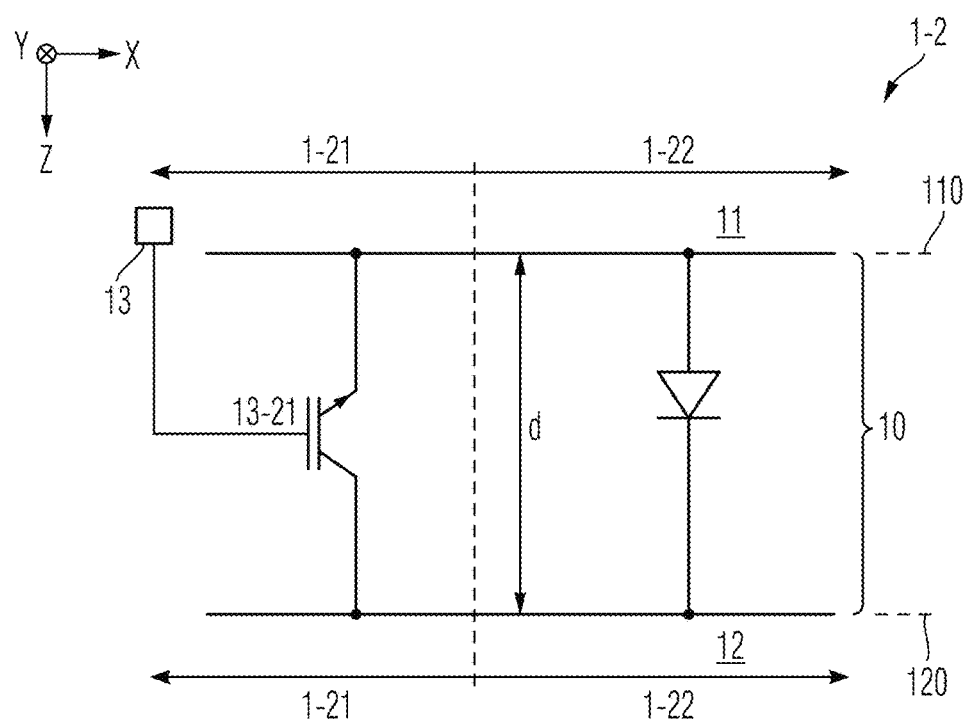
FIG. 2 schematically and exemplarily illustrates a simplified representation of an RC IGBT in accordance with one or more embodiments.

Now also referring to FIG. 2, the semiconductor body 10 of the RC IGBT 1 may extend in both the active region 1-2 and the edge termination region 1-3 and has said first side (herein also referred to as frontside) 110 and a second side (herein also referred to as backside) 120. The frontside 110 and the backside 120 may vertically terminate the semiconductor body 10.

A thickness d of the semiconductor body 10 can be defined as the distance, in the active region 1-2, along the vertical direction Z between the frontside 110 and the backside 120.

In the lateral directions, the semiconductor body 10 may be terminated by the edge 1-4 (as described above with respect to FIG. 1). Furthermore, both the frontside 110 and the backside 120 may extend laterally along both the first lateral direction X and the second lateral direction Y. For example, both the frontside 110 and the backside 120 may form a respective substantially horizontal surface of the semiconductor body 10.

In an embodiment, a total lateral extension of the IGBT section 1-21 in at least one of the first lateral direction X or the second lateral direction Y amounts to at least 50% of the semiconductor body thickness d. The total lateral extension of the IGBT section 1-21 may also be greater than 50% of the thickness d, e.g., greater than 2*d, or even greater than 5*d.

In an embodiment, a total lateral extension of each of the diode sections 1-22 in at least one of the first lateral direction X or the second lateral direction Y amounts to at the semiconductor body thickness d or to at least the thickness of a drift region 100. The total lateral extension of the diode section 1-22 may also be greater than d. For example, the horizontal area of each of at least two of the diode sections 1-22 has a minimum lateral extension along the first lateral direction X and/or along the second lateral direction Y amounting at least 50% of the semiconductor body thickness d or to at least 50% of the drift region thickness.

Both the first load terminal 11 and a control terminal 13 may be at the semiconductor body frontside 110, and a second load terminal 12 can be at the semiconductor body backside 120.

The IGBT section 1-21 is configured for conduction of a forward load current between the first load terminal 11 and the second load terminal 12, e.g., (in case of an n-channel IGBT) if the electrical potential at the second load terminal 12 is greater than the electrical potential at the first load terminal 11. The forward load current can hence be considered as an IGBT load current.

The diode section 1-22 is configured for conduction of a diode load current (herein also referred to as "reverse load current") between the first load terminal 11 and the second load terminal 12, e.g., if the electrical potential at the second load terminal 12 is lower than the electrical potential at the first load terminal 11. The diode load current can hence be considered as a reverse load current.

In an embodiment, the diode section 1-22, which conducts the diode load current, can be spatially separated from the IGBT section 1-21, which conducts the forward load current. As indicated above, the diode section 1-22 is not part of the IGBT section 1-21, but separated therefrom, and does for example not include any source region 101 of the first conductivity type electrically connected to the first load terminal 11; rather, the diode section 1-22 is a "large diode-only region" of the active region 1-2, in accordance with some embodiments.

For example, in an embodiment, a path of the forward load current formed in the semiconductor body 10 and a path of the diode load current formed in the semiconductor body 10 do not spatially overlap considerably with each other. For example, none or less than 20% or even less than 10% of the forward (IGBT) load current flows through the diode section(s) 1-22.

Furthermore, in an embodiment, the current flow in the diode section 1-22 changes by less than 50%, or less than 30% or even less than 20% when a control signal 13-21 is changed (e.g., the control signal provided to control electrodes 141 mentioned below). For example, the diode section 1-22 is independent from the control signal 13-21 (e.g., the control signal provided to control electrodes 141 mentioned below). For example, the diode section 1-22 may be configured such that it conducts the diode load current as soon as the electrical potential (of the typical polarity) at the second load terminal 12 is lower (at least by the diode section internal threshold voltage) than the electrical potential at the first load terminal 11, irrespective of the control signal 13-21 provided to the IGBT section 1-21, that is, irrespective of the current potential of the control electrodes 141.

In accordance with the terminology typically associated with RC IGBTs, the control terminal 13 can be a gate terminal, the first load terminal 11 can be an emitter terminal and the second load terminal 12 can be a collector terminal.

For example, the first load terminal 11 comprises a frontside metallization and/or the second load terminal 12 comprises a backside metallization. At the frontside 110, the semiconductor body 10 may interface with the frontside metallization. At the backside 120, the semiconductor body 10 may interface with the backside metallization.

In an embodiment, the first load terminal 11 (e.g., said frontside metallization) overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. For example, as exemplary illustrated in FIGS. 3 and 4, said local contacts can be established by means of first contact plugs 111 penetrating an insulation structure 119 so as to contact mesas 17, 18 formed in the semiconductor body 10.

Analogously, in an embodiment, the second load terminal 12 (e.g., said backside metallization) overlaps, that is, along the first lateral direction X and/or the second lateral direction Y and/or combinations thereof, with the active region 1-2. It shall be noted that the second load terminal 12 is for example not structured but formed homogeneously and monolithically at the semiconductor body backside 120, e.g., so as to establish a laterally homogeneous contact (i.e., a contiguous contact surface) with the semiconductor body 10 at the backside 120. Such homogeneous structure may also be implemented in regions where the second load terminal 12 overlaps with the edge termination region 1-3.

For example, the lateral boundary of the active region 1-2 is defined by the lateral boundary of the outermost power cells of the IGBT section(s) 1-21 and or of the diode section(s) 1-22. Hence, the lateral boundary of the active region 1-2 may be defined at the frontside 110 (cf. FIG. 1). For example, all functional elements to enable conduction of the diode load current and the forward load current are present in the active region 1-2 of the RC IGBT 1, e.g., including at least a part of the first load terminal 11 (e.g., a frontside metal contact thereof, e.g., one or more of the first contact plugs 111), source region(s) 101, a body region 102 (or, respectively, a first anode region 1061), a drift region 100, an IGBT emitter region 103, a diode emitter region 104 and the second load terminal 12 (e.g., a backside metal thereof), as will be explained in more detail below.

Furthermore, the lateral transition (along the first or second lateral direction X; Y or combinations thereof) between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be theoretically observed at the backside 120.

Figure 3:
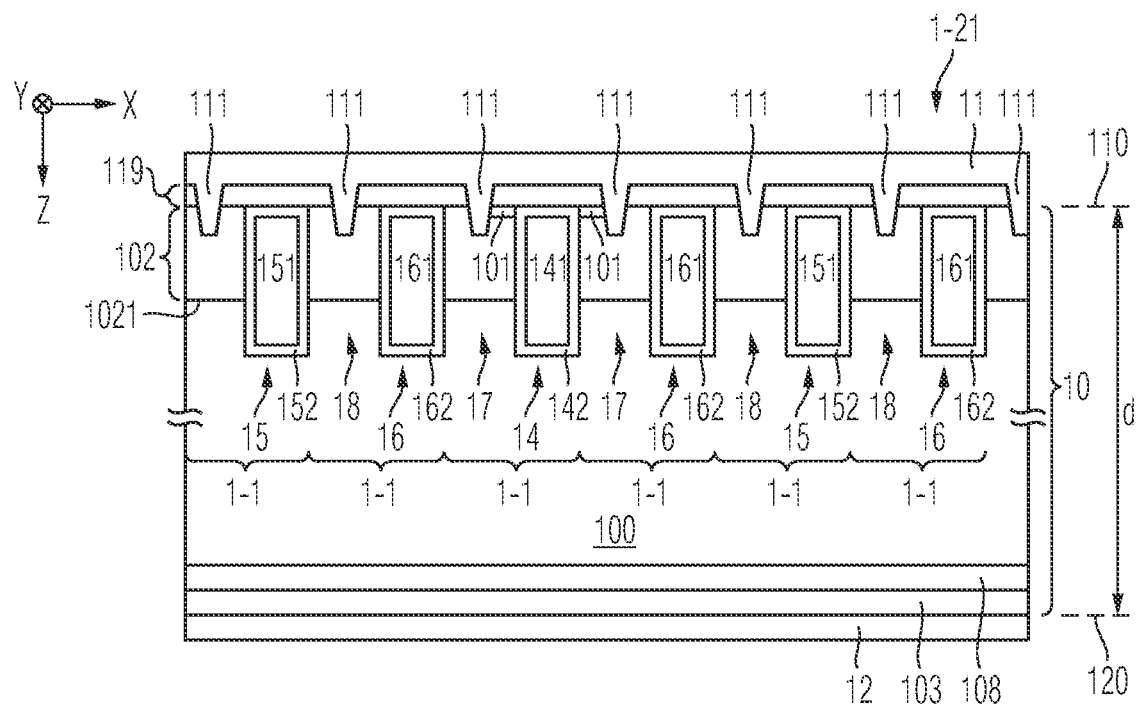
FIG. 3 schematically and exemplarily illustrates a section of a vertical cross-section of an IGBT section of an RC IGBT in accordance with one or more embodiments.
Figure 4:
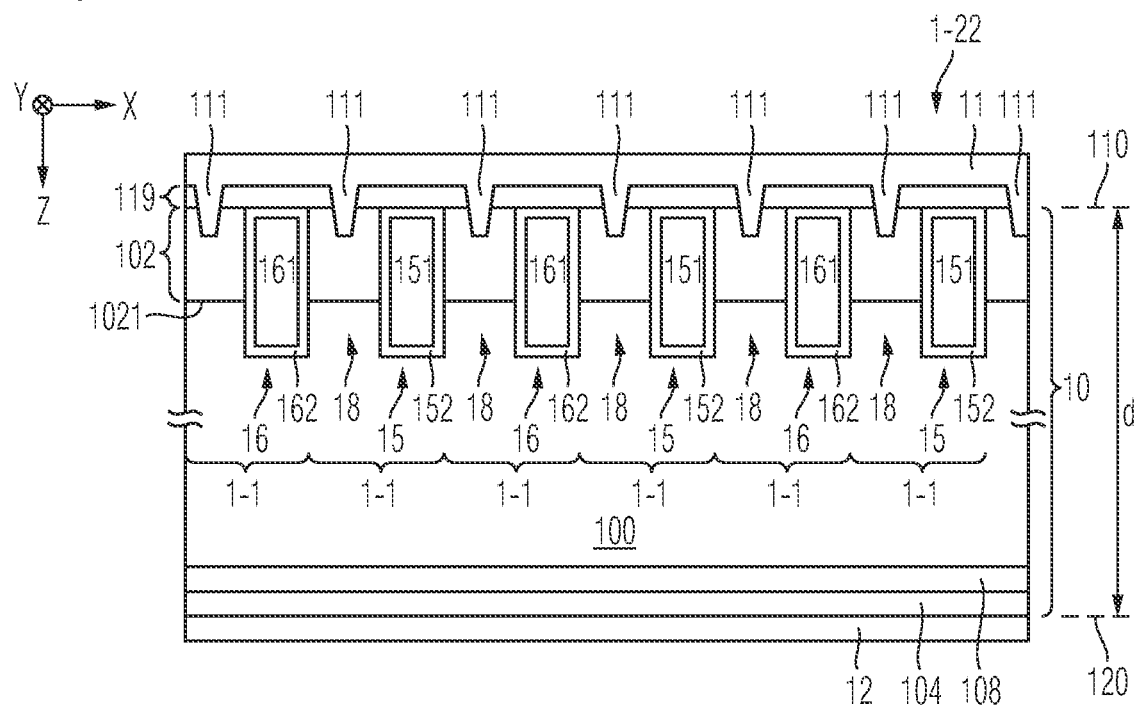
FIG. 4 schematically and exemplarily illustrates a section of a vertical cross-section of a diode section of an RC IGBT in accordance with one or more embodiments.
Figure 5:
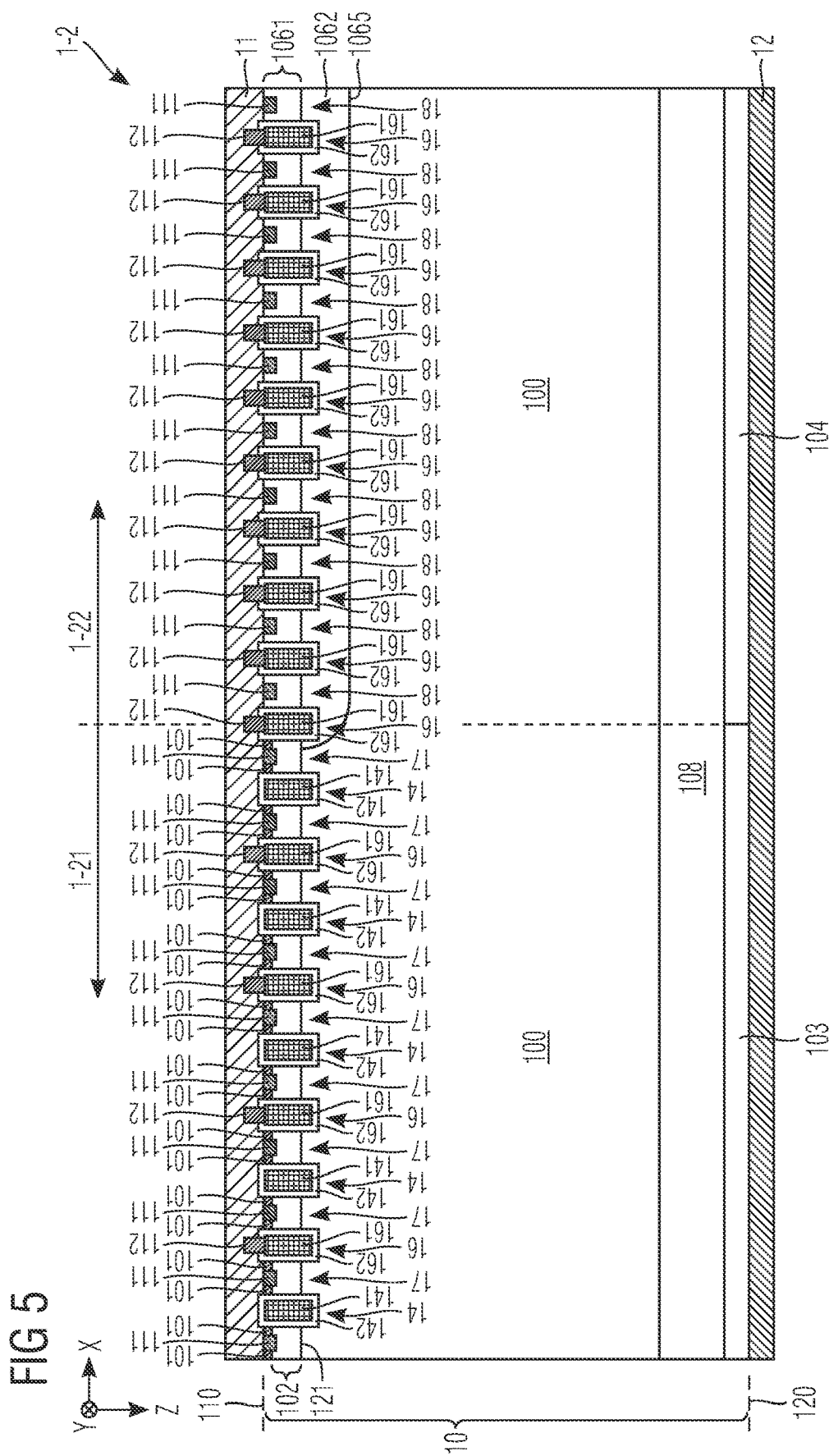
FIGS. 5-10 each schematically and exemplarily illustrate a section of a vertical cross-section of an RC IGBT in accordance with one or more embodiments.

Now referring to FIGS. 3 to 4 in more detail, a plurality of trenches may extend into the semiconductor body 10. The trenches may include one or more control trenches 14, one or more dummy trenches 15, and/or one or more source trenches 16. The trenches 14, 15 and 16 are arranged in parallel to each other along the first lateral direction X and extend into the semiconductor body 10 along the vertical direction Z. Each trench may have a stripe configuration extending along the second lateral direction Y from a respective first section of the lateral circumference 1-20 (cf. FIG. 1) towards a respective second section of the lateral circumference 1-20 opposite of the respective first section. Each trench 14, 15, 16 houses a respective trench electrode 141, 151 and 161 that may or may not be electrically connected to a defined electrical potential, e.g., to the potential of the one of the control terminal 13 or the first load terminal 11. For example, the trench electrodes 151 of the dummy trenches 15 are electrically floating, e.g., not connected to a defined electrical potential. That is, the electrical potentials of the IGBT trench electrodes 141, 151, 161 may differ from each other. In an embodiment, the dummy trenches 15 are not implemented; i.e., the RC IGBT 1 then comprises trenches only in the form of control trenches 14 and source trenches 16.

The trench electrodes 141, 151, 161 are isolated from the semiconductor body 10 by a respective trench insulator 142, 152, 162.

Two adjacent trenches may define a respective mesa in the semiconductor body 10. The mesas include IGBT mesas 17 and diode mesas 18.

For example, each trench 14, 15, 16 may have a stripe configuration, meaning that the respective trench length (e.g., along the second lateral direction Y) is much greater than the respective trench width (e.g., along the first lateral direction X). Hence, also each mesa 17, 18 may have a stripe configuration.

The trench electrodes 141 can be electrically connected to the control terminal 13 and are hence referred to as control electrodes 141. Via the control terminal 13, the control electrodes 141 may be provided with said control signal 13-21.

If the optional trenches 15 are provided, the trench electrodes 151 (or a subset thereof) can be electrically floating are hence referred to as floating trench electrodes 151. In another embodiment, the trench electrodes 151 (or a subset thereof) are electrically connected to the IGBT control terminal 13 but do not directly control conduction of the load current as no electrically connected source region 101 (connected to the first load terminal 11) is arranged adjacent to the respective dummy trench 15. In yet another embodiment, the trench electrodes 151 (or a subset thereof) are connected to an electrical potential different from the electrical potential of the control terminal 13 and different from the electrical potential of the first load terminal 11.

The trench electrodes 161 can be electrically connected to the first load terminal 11 and are hence referred to as source trench electrodes 161.

Each trench type can be of equal dimensions in terms of width along the first lateral direction X and depth along the vertical direction Z (e.g., a distance between frontside 110 and a trench bottom) and/or length along the second lateral direction Y.

The IGBT section 1-21 may comprise a plurality of IGBT cells, each IGBT cell having a certain trench pattern, i.e., a lateral sequence (along the first lateral direction X) of trenches of specific types, e.g. one or more control trenches 14, zero or more dummy trenches 15, and zero or more source trenches 16 and zero or more other trenches.

Analogously, each of the diode sections 1-22 may comprise a number of diode cells, each diode cell having a certain trench pattern, i.e., a lateral sequence of trenches of specific types, e.g. zero or more dummy trenches 15, one or more source trenches 16 and/or zero or more other trenches.

In an embodiment, none of the diode sections 1-22 includes one of the control trenches 14, e.g., in the diode sections 1-22, there is no trench electrode electrically connected to the control terminal 13. For example, none of the control trenches 14 extends into one or more of the diode sections 1-22. For example, the diode sections 1-22 are separated from the IGBT section 1-21 and in particular from the control trenches 14 (i.e., from the control electrodes 141). This may allow for achieving desired diode properties, such as little or no dependence on the potential of the control electrodes 141 and/or low switching losses.

It may be provided that the trenches in both the IGBT section 1-21 and the diode section 1-22 are laterally arranged next to one another in accordance with the same pitch; e.g., the mesa width (that is, the distance along the first lateral direction X between two adjacent trenches) does not alter between the sections 1-21 and 1-22, in accordance with an embodiment.

The mesa width may, in an embodiment, amount to no more than 1/30 or to no more than 1/60 of the semiconductor body thickness d.

Also, the trenches 14, 15, 16 may, in an embodiment, each exhibit the same trench depth (total vertical extension). For example, the mesa width amounts to no more than 50% or to no more than 30% of the trench depth.

In an embodiment, the mesa width may amount to no more than 10 µm, or no more than 5 µm, or no more than 1

μm. For example, in the latter case, adjacent trenches are hence laterally displaced from each other by no more than 1 μm.

As explained above, the mesa width may be identical for both sections 1-21 and 1-22, or it varies between the sections. In a further embodiment, the mesa width in the IGBT section 1-21 is less than 80%, less than 65% or even less than 50% of the mesa width in the diode section 1-22. For example, the average density of the total of the trench electrodes 141, 151, 161 can also be same for both sections 1-21 and 1-22. However, the trench pattern, e.g., the arrangement of the different types of trenches may vary between the sections 1-21 and 1-22. One exemplary variation is that the density of control electrodes 141 in the IGBT section 1-21 is at least twice as high as the density of control electrodes 141 in the diode section 1-22 (which may even amount to zero).

In an illustrative example, the total number of trench electrodes 141, 151, 161 in the IGBT section 1-21 is 120, and 40 trench electrodes are control electrodes 141, yielding a control electrode density of ⅓. For example, the total number of trench electrodes in the diode section 1-22 is fifty, and no more than five trench electrodes are control electrodes 141, yielding an control electrode density of no more than ⅒. In an embodiment, said trench electrodes in the diode section 1-22 do not include any control electrode 141.

In an embodiment, at least 50% of the trench electrodes of the trenches in the diode section 1-22 are electrically connected to the first load terminal 11, i.e., at least 50% of the trench electrodes of the trenches in the diode section 1-22 are source trench electrodes 161 of source trenches 16. In an embodiment, each of the trench electrodes in the diode section 1-22 is a source trench electrode 141.

In an embodiment, at least 50% of the trench electrodes of the trenches in the IGBT section 1-21 are electrically connected to the first load terminal 11, i.e., at least 50% of the trench electrodes of the trenches in the IGBT section 1-21 are source trench electrodes 161 of source trenches 16.

For example, the trench electrodes in the diode section 1-22 are either source trench electrodes 161 or dummy trench electrodes 151. Furthermore, all or some of the diode mesas 18 in the diode section 1-22 may be electrically connected to the first load terminal 11, e.g., by means of the first contact plugs 111.

Still referring to FIGS. 1-4, the RC-IGBT 1 further comprises a drift region 100 of the first conductivity type formed in the semiconductor body 10 and extending into the diode section 1-22 and the IGBT section 1-21.

A body region 102 of the second conductivity type is formed in the IGBT mesas 17 and the diode mesas 18 of the semiconductor body 10 in the diode sections 1-22 and the IGBT section 1-21. At least portions of the body region 102 are electrically connected to the first load terminal 11. The body region 102 may form pn-junctions to mesa subsections of the first conductivity type.

Further, one or more mesas (not illustrated) in at least one of the diode section 1-22 and the IGBT section 1-21, may not be electrically connected to the first load terminal 11 in order to form "dummy mesas", i.e., those mesas not used for load current conduction, neither for forward load current nor for reverse load current conduction.

In the IGBT section 1-21, source regions 101 of the first conductivity type are arranged at the frontside 110 and electrically connected to the first load terminal 11. The source regions 101 are, e.g., only locally provided in the IGBT section 1-21 and do for example not extend into the diode sections 1-22.

The body region 102 may be arranged in electrical contact with the first load terminal 11, e.g., by means of the first contact plugs 111. In each IGBT cell of the IGBT section 1-21, there can furthermore be provided at least one of the source regions 101 of the first conductivity type arranged in electrical contact with the first load terminal 11, e.g., also by means of the first contact plugs 111.

A larger part of the semiconductor body 10 is formed as the drift region 100, which is of the first conductivity type, and which may interface with the body region 102 and form a pn-junction 1021 therewith. The body region 102 isolates the source regions 101 from the drift region 100. Herein, the term "body region 102" refers to the semiconductor region of the second conductivity type electrically connected, at the frontside 110, to the first load terminal 11. This region 102 extends into both the IGBT section 1-21 and the diode section 1-22 (which is hence herein also referred to as "first anode region 1061"). The implementation of the body region 102 in the IGBT section 1-21 may not or may differ from the implementation of the body region 102 in the diode sections 1-22, e.g., in terms of dopant concentration, dopant dose, dopant profile and/or spatial extension. To distinguish the body region in the diode section 1-22, it will, with respect to FIGS. 5-10, be referred to as first anode region 1061.

Upon receipt of the control signal 13-21, e.g., provided by a non-illustrated gate driver unit, each control electrode 141 can induce an inversion channel in a section of the body region 102 adjacent to the respective control electrode 141. Thus, each of the number of IGBT cells may be configured for conducting at least a portion of the forward load current between the first load terminal 11 and the second load terminal 12.

In an embodiment, the drift region 100 extends along the vertical direction Z, until it merges into a field stop layer 108, wherein the field stop layer 108 is also of the first conductivity type, but exhibits a higher dopant dose as compared to the drift region 100. The field stop layer 108 is typically of significantly smaller thickness than the drift region 100.

The drift region 100, or, if present, the field stop layer 108, extends along the vertical direction Z until adjoining with either an IGBT emitter region 103 of the IGBT section 1-21 and a diode emitter region 104 of the diode section 1-22.

The diode emitter region 104 is of the first conductivity type and electrically connected to the second load terminal 12 and coupled to the drift region 100, e.g., by means of the field stop layer 108.

The IGBT emitter region 103 is of the second conductivity type and electrically connected to the second load terminal 12 and coupled to the drift region 100, e.g., by means of the field stop layer 108.

Both the IGBT emitter region 103 of the IGBT section 1-21 and the diode emitter region 104 of the diode section 1-22 can be arranged in electrical contact with the second load terminal 12.

Overall, the IGBT emitter region 103 may act as an emitter of the second conductivity type. Furthermore, the IGBT emitter region 103 does in some embodiments not comprise any section of the first conductivity type, which exhibit a rather high dopant concentration, typically in the range of $10^{16}$ cm$^{-3}$ to $10^{20}$ cm$^{-3}$, rather, the diode emitter region 104 is exclusively formed in the diode section 1-22, in accordance with some embodiments. In other embodiments, the IGBT emitter region 103 may comprise one or sections of the first conductivity type, e.g., only in a certain subsection of the IGBT emitter region 103, as will be described further below.

In an embodiment, the average dopant concentration of the drift region 100 may be in the range of $10^{12}$ cm$^{-3}$ to $10^{14}$ cm$^{-3}$.

In an embodiment, the dopant concentration of each source region 101 in the IGBT section 1-21 may be in the range of $10^{19}$ cm$^{-3}$ to $10^{21}$ cm$^{-3}$.

In an embodiment, the dopant concentration of the body region 102 may be in the range of $10^{16}$ cm$^{-3}$ to $10^{18}$ cm$^{-3}$. As described above, e.g., the dopant concentration of the body region 102 in the IGBT section 1-21 may be equal to or different from the dopant concentration of the body region 102 (i.e., the first anode region 1061, cf. FIGS. 5-10) in the diode section 1-22.

In an embodiment, the dopant concentration of the (optional) field stop layer 108 may be in the range of $10^{14}$ cm$^{-3}$ to $3*10^{16}$ cm$^{-3}$.

In an embodiment, the dopant concentration of the IGBT emitter region 103 may be in the range of $10^{16}$ cm$^{-3}$ to $10^{18}$ cm$^{-3}$. However, in an embodiment, the net dopant concentration may vary (and even change is polarity) along the lateral extension of the IGBT emitter region 103.

In an embodiment, the dopant concentration of the diode emitter region 104 may be in the range of $10^{19}$ cm$^{-3}$ to $10^{21}$ cm$^{-3}$. However, in an embodiment, the net dopant concentration may vary (and even change is polarity) along the lateral extension of the diode emitter region 104.

It shall be noted that the trench patterns illustrated in FIGS. 3 and 4 are only exemplary; other trench patterns are possible and will be described further below.

In an embodiment, the diode section 1-22 is not equipped with source regions 101, e.g., at least not with source regions 101 arranged adjacent to a respective one of the control trenches 14. For example, in the diode section 1-22, there is no doped semiconductor region of the first conductivity type electrically connected to the first load terminal 11. Rather, for forming the diode configuration in the diode section 1-22 for conduction of the diode load current, only the body region 102 is electrically connected to the first load terminal 11, wherein the body region 102 forms the pn-junction 1021 with, e.g., the drift region 100, and along the vertical direction Z towards the second load terminal 12, below said pn-junction 1021, there is a semiconductor path of only the first conductivity type, not interrupted by any further regions of the second conductivity type.

As explained above, in contrast to the diode section 1-22, the IGBT section 1-21 comprises at least one IGBT cell with a section of the source region 101 connected to the first load terminal 11 and arranged adjacent to one of the control trenches 14 and isolated from the drift region 100 by the body region 102, in accordance with an embodiment. For example, the lateral boundary of the IGBT section 1-21 is defined by the lateral boundary of the outermost IGBT cell(s). Hence, the lateral boundary of the IGBT section 1-21 may be defined at the frontside 110. This lateral boundary can be defined by (an) outermost source region(s) 101. For example, all functional elements to enable conduction of the forward/IGBT load current are present in a vertical projection of the IGBT section 1-21 of the power semiconductor device 1, e.g., including at least the first load terminal 11 (e.g., a frontside metal contact thereof, e.g., one or more of the first contact plugs 111), the source region(s) 101, the body region 102, the drift region 100, the IGBT emitter region 103, and the second load terminal 12 (e.g., a backside metal thereof). Furthermore, said functional elements may extend along the total lateral extension of the IGBT section 1-21.

In an embodiment, said first contact plugs 111 are part of a contact plug structure of the power semiconductor device 1. Each first contact plug 111 can be configured to establish contact with one of the mesas 17, 18 so as to electrically connect that mesa 17/18 to the first load terminal 11. As illustrated, each first contact plug 111 may extend from the frontside 110 along the vertical direction Z into the respective mesa 17/18.

FIG. 5 to FIG. 10 illustrate various embodiments of the RC IGBT 1. In accordance with these embodiments, the RC IGBT 1 comprises the active region 1-2 with the IGBT section 1-21 and the diode section 1-22; the semiconductor body 10 having the first side 110 and the second side 120; the first load terminal 11 at the first side 110 and the second load terminal 12 at the second side 120; the plurality of control trenches 14 and the plurality of source trenches 16, said pluralities of trenches 14, 16 being arranged in parallel to each other along the first lateral direction X and extending into the semiconductor body 10 along the vertical direction Z, wherein the plurality of source trenches 16 extends into both the IGBT section 1-21 and the diode section 1-22; the plurality of IGBT mesas 17 and a plurality of diode mesas 18 in the semiconductor body 10, said mesas 17, 18 being laterally confined, along the first lateral direction X, by respective two of said pluralities of trenches 14, 16.

Each IGBT mesa 17 comprises: at least one source region 101 of the first conductivity type electrically connected to the first load terminal 11, and the body region 102 of the second conductivity type electrically connected to the first load terminal 11 and isolating the source region 101 from another first conductivity type region of the RC IGBT 1.

Each diode mesa 18 comprises: the first anode region 1061 of the second conductivity type electrically connected to the first load terminal 11.

The RC IGBT 1 further comprises: in the semiconductor body 10 and at the second side 120, both the diode emitter region 104 of the first conductivity type that forms a part of the diode section 1-22 and that exhibits a lateral extension in the first lateral direction X amounting to at least 50% of the drift region thickness or to at least 50% of the semiconductor body thickness d; and the IGBT emitter region 103 of the second conductivity type that forms a part of the IGBT section 1-21 and that exhibits a lateral extension in the first lateral direction X amounting to at least 70% of the drift region thickness or to at least 70% of the semiconductor body thickness d.

The RC IGBT further comprises, in the diode section 1-22, a second anode region 1062 of the second conductivity type electrically connected to the first load terminal 11. The second anode region 1062 extends deeper along the vertical direction Z as compared to the trenches 14, 16 in the diode section 1-22. The second anode region 1062 overlaps with the diode emitter region 104 for at least 5% of the horizontal area of the diode emitter region 104.

In accordance with the embodiments that are exemplarily illustrated in FIGS. 5-10, based on the second anode region 1062, an overvoltage during turn-on of the diode section(s) 1-22 of the RC IGBT 1 (e.g., when a load current commutates from another RC IGBT into the RC IGBT 1 and the RC IGBT 1 acts as freewheeling diode) can be reduced. At the same time, the diode properties of the RC IGBT 1 can be mainly independent from the voltage of the control signal 13-21. The benefits may in particular be advantageous if the RC IGBT 1 is arranged in a half-bridge configuration.

If not stated otherwise, the description with respect to FIGS. 1-4 equally applies to FIGS. 5-10.

In an embodiment, further one or more further mesas are provided in at least one of the diode section 1-22 and the IGBT section 1-21, wherein each of the one or more further mesas is different from both the diode mesa 18 and the IGBT mesa 17. For example, in the IGBT section 1-21, mesas are provided that do not include a source region 101 and/or that are not electrically connected to the first load terminal 11.

For example, the drift region thickness mentioned herein is the distance, along the vertical direction Z, between the pn-junction of one of the IGBT mesas 17 of the IGBT section 1-21 and a transition between the drift region and the field stop layer 108, wherein said transition can be, e.g., located at a vertical level where the dopant concentration has increased, along the vertical direction Z, by at least by a factor of two.

Even though FIGS. 5-10 indicate a clear transition between the first anode region 1061 and the second anode region 1062, it shall be noted that in accordance with one or more embodiments, the dopant concentrations in both regions 1061 and 1062 may be similar (e.g., the dopant concentration of the first anode region 1061 may be slightly smaller as compared to the dopant concentration of the second anode region 1062, e.g., where the first anode region 1061 and the second anode region 1061 adjoin with each other), such that the transition between the regions 1061 and 1062 is not clearly recognizable. For example, the first anode region 1061 overlaps or merges seamlessly into the second anode region 1062. Thus, the first anode region 1061 and the second anode region 1062 may form a contiguous region of the second conductivity type within the respective diode mesa 18.

Still referring to each of FIGS. 5-10, some further optional aspects shall be described in the following:

The second anode region 1062 may exhibit a dopant dose within the range of $1*10^{12}$ cm$^{-2}$ to $1*10^{14}$ cm$^{-2}$ or within the range of $1*10^{12}$ cm$^{-2}$ to $2*10^{13}$ cm$^{-2}$, or within the range of $1*10^{13}$ cm$^{-2}$ to $5*10^{14}$ cm$^{-2}$.

In each diode mesa 18, the first anode region 1061 may exhibit the same dopant dose, e.g., within the range of $5*10^{12}$ cm$^{-2}$ to $1*10^{14}$ cm$^{-2}$.

In each IGBT mesa 18, the body region 102 may exhibit the same dopant dose, e.g., within the range of $5*10^{12}$ cm$^{-2}$ to $1*10^{14}$ cm$^{-2}$.

As used herein, the term average dopant concentration of a semiconductor region relates to the spatial average dopant concentration, e.g., the number of dopants divided by the volume of the region. As used herein, the term dopant dose relates to the dopant concentration integrated along the vertical direction Z.

For example, the average dopant concentration of the second anode region 1062 is within the range of 50% to 1000% of the average dopant concentration of the first anode regions 1061. Hence, the average dopant concentration of the second anode region 1062 may be identical, smaller or greater as compared to the average dopant concentration of the first anode regions 1061. Which variant is chosen may, e.g., depend on the designated emitter efficiency of the diode section 1-22. For example, a smaller average dopant concentration of the second anode region 1062 may be appropriate in order to limit the emitter efficiency in the diode section 1-22.

Further, the average dopant concentration of the first anode regions 1061 can be lower as compared to the average dopant concentration of the body regions 102. Here, it is noted that directly below the contact plugs 111, highly doped contact regions may be placed, e.g. by implantation through the contact hole. The dopant doses and the average dopant concentrations of the body regions 102 and the first and second anode regions 1061, 1062 are defined without the doping of these highly doped contact regions.

In an embodiment, the body region 102 in the IGBT section 1-21 does not extend as far along the vertical Z direction as compared to the second anode region 1062. For example, the second anode region 1062 extends below the vertical level of the trench bottoms, whereas the body region 102 does not extend as far along the vertical direction Z. For example, the pn-junction 1021 formed by the body region 102 is arranged above the vertical level of the trench bottoms, and a pn-junction 1065 formed by the second anode region 1062 is arranged below the vertical level of the trench bottoms.

In an embodiment, the IGBT section 1-21 may include both the source trenches 16 and the control trenches 14, e.g., arranged in an alternating manner along the first lateral direction X. The diode section 1-22 for example only includes source trenches 16. The source trench electrodes 161 may be electrically connected to the first load terminal 11 based on second contact plugs 112.

In an embodiment, the IGBT section 1-21 and the diode section 1-22 are strictly separated from each other. For example, to this end, the second anode region 1062 does not or only insignificantly extend into the IGBT section 1-21 (cf. for example FIG. 5, where the second anode region 1062 does overlap with no more than one of the source regions 101 of the IGBT section 1-21, but not with a channel region of the IGBT section 1-21). Furthermore, it may be provided that the diode section 1-22 does not comprise any IGBT mesa 17 (i.e., a mesa including a source region 101 electrically connected to the first load terminal 11). Accordingly, it may be ensured that each diode mesa 18 is void of a first conductivity type region electrically connected to the first load terminal 11. It may also be provided that the diode section 1-22 does not comprise any control trench 14 (i.e., a trench including a trench electrode electrically connected to the control terminal 13).

In an embodiment, the second anode region 1062 overlaps for at least 10% and up to possibly 100% of a horizontal interface area formed by the diode mesas 18 in the diode section 1-22 with a portion of the semiconductor body 10 below thereof. That is, the second anode region 1062 may either contiguously and horizontally (e.g., along the first and second lateral direction X and Y) extend throughout the entire diode section 1-22, yielding a 100% overlap with said interface area (cf. FIG. 5), or, the second anode region 1062 may exhibit a lateral structure, which will be explained with respect to FIGS. 6-10, which may yield an overlap of less than 100% with said interface area. Accordingly, it may also be provided that the second anode region 1062 overlaps with the diode emitter region 104 for no more than 50% of the horizontal area of the diode emitter region 104. By configuring the lateral structure of the second anode region 1062, the anode efficiency of the RC IGBT 1 may be adjusted.

Figure 6:
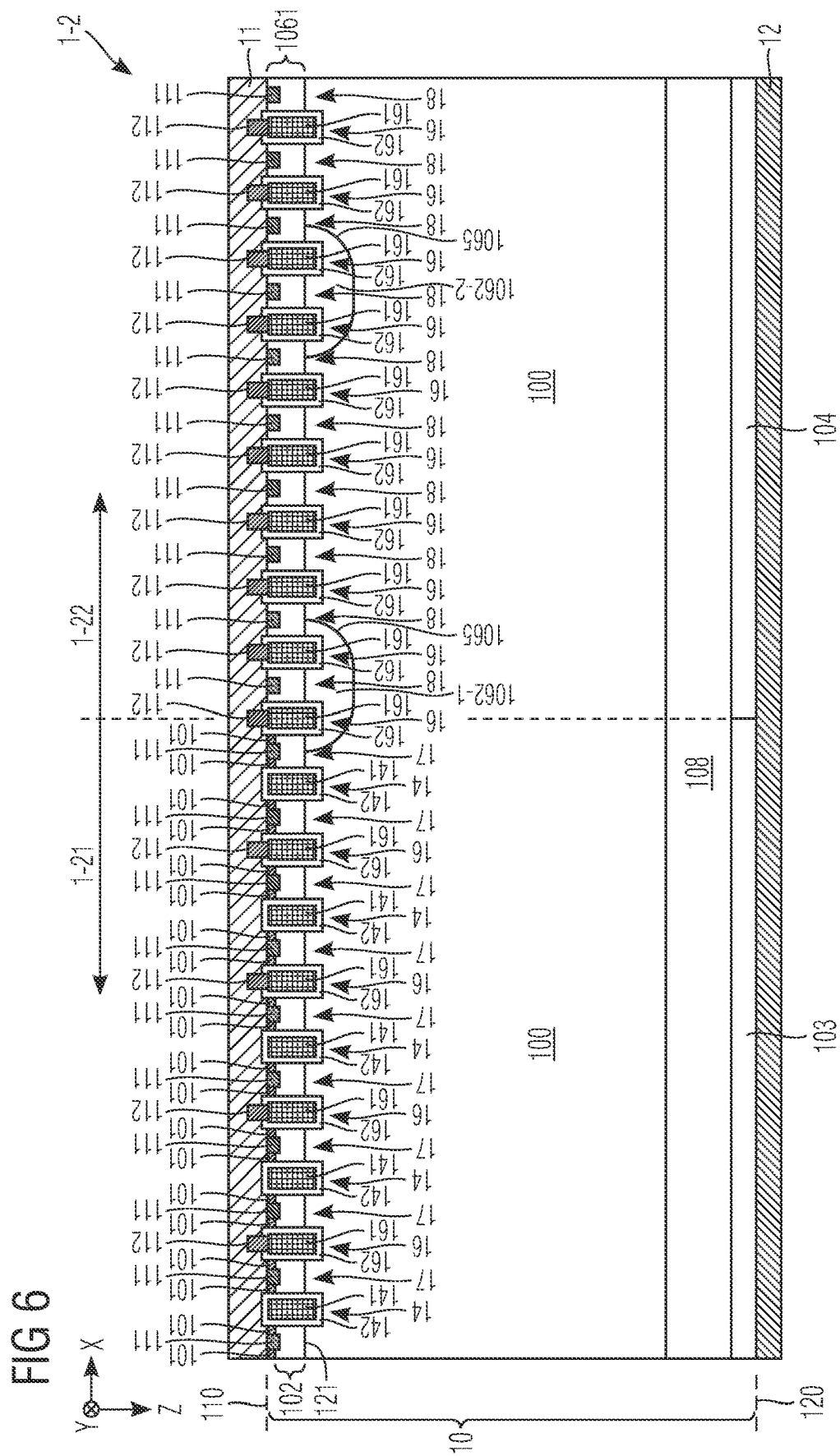

Now referring to the embodiment illustrated in FIG. 6, the second anode region 1062 is provided with a lateral structure. For example, the second anode region 1062 comprises (or, respectively, consists of) two or more anode subregions 1062-1, 1062-2 spaced apart from each other along the first lateral direction X and/or along the second lateral direction Y. For example, each anode subregion 1062-1, 1062-2 has a lateral extension in the first lateral extension X within the range of once the mesa width to 20 times the mesa width, and the distance along the first lateral direction between two adjacent anode subregions 1062-1, 1062-2 maybe within the range of twice the mesa width to 40 times the mesa width.

Further, each anode subregion 1062-1, 1062-2 can have a lateral extension in the second lateral extension Y corresponding to the lateral extension of the trench(es) and mesa(s) it overlaps with (alternatively, the anode subregions 1062-1, 1062-2 may also be structured along the second lateral direction Y). Accordingly, each of the two or more anode subregions 1062-1, 1062-2 may exhibit a stripe configuration (as illustrated in FIG. 1), wherein the respective stripe configuration extends in parallel to the diode mesas 18 (as illustrated in FIG. 6) or perpendicular thereto or in any other horizontal direction. Each of the two or more anode subregions 1062-1, 1062-2 can hence have a first lateral extension amounting to at least a width of one of the diode mesas 18 in the first lateral direction X, and/or a second lateral extension perpendicular thereto and amounting to at least twice the first lateral extension. Further, the anode subregions 1062-1, 1062-2 may be arranged in parallel to each other, wherein a minimum distance between each two of the two or more anode subregions 1062-1, 1062-2 in a direction in parallel to the respective first lateral extension amounts to at least the diode mesa width WM.

In accordance with an embodiment, the two or more anode subregions 1062-1, 1062-2 provide a low turn-on overvoltage of the diode section 1-22 since they can inject holes rapidly without being hindered by the trenches 16. On the other hand, during diode on-state (at low voltage), the electrons can leave the semiconductor body 10 towards the first load terminal 11 through the (optionally lower doped and more shallow continuous) first anode region 1061 such that not too many holes are injected.

Figure 7:
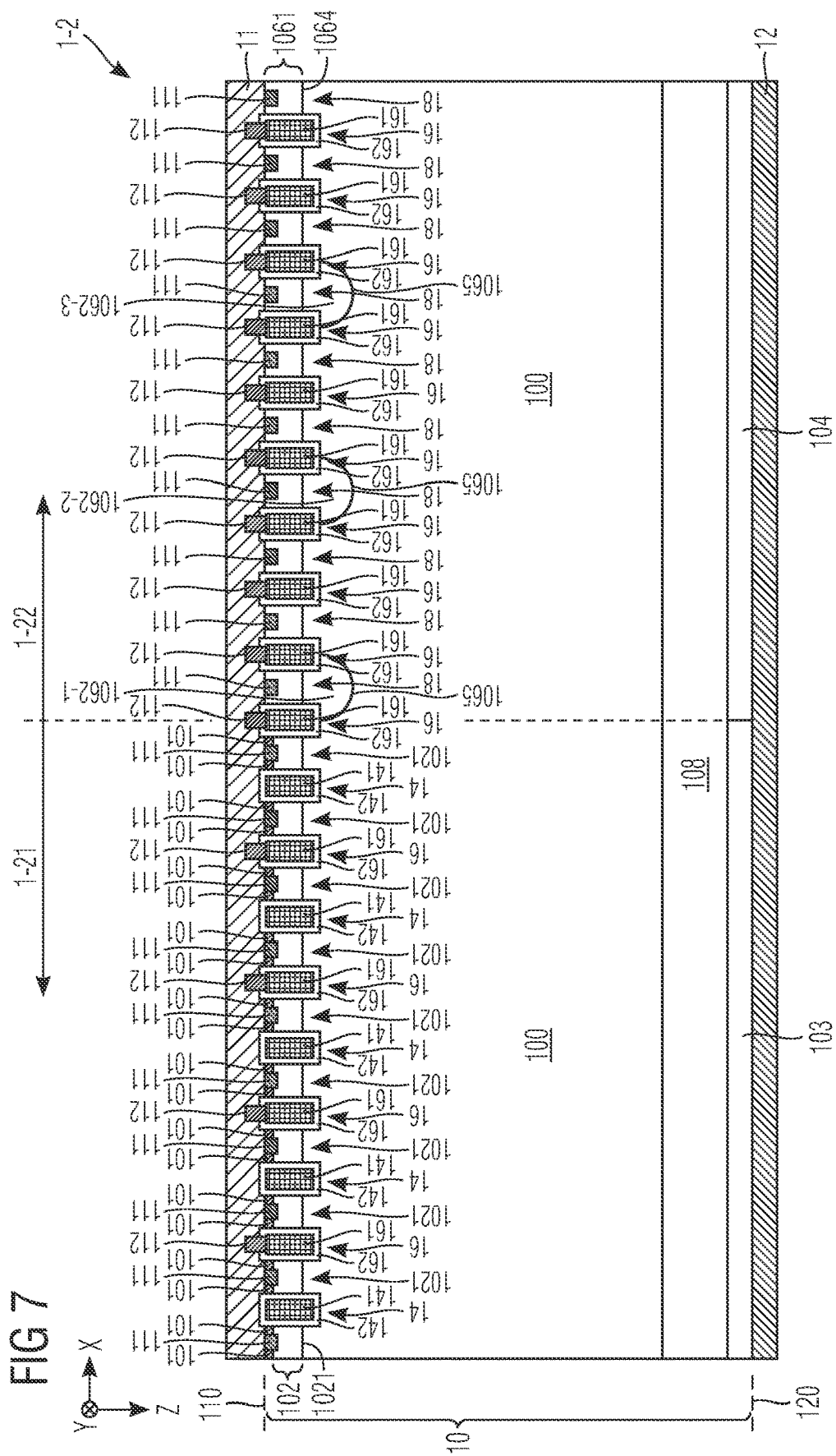
Figure 8:
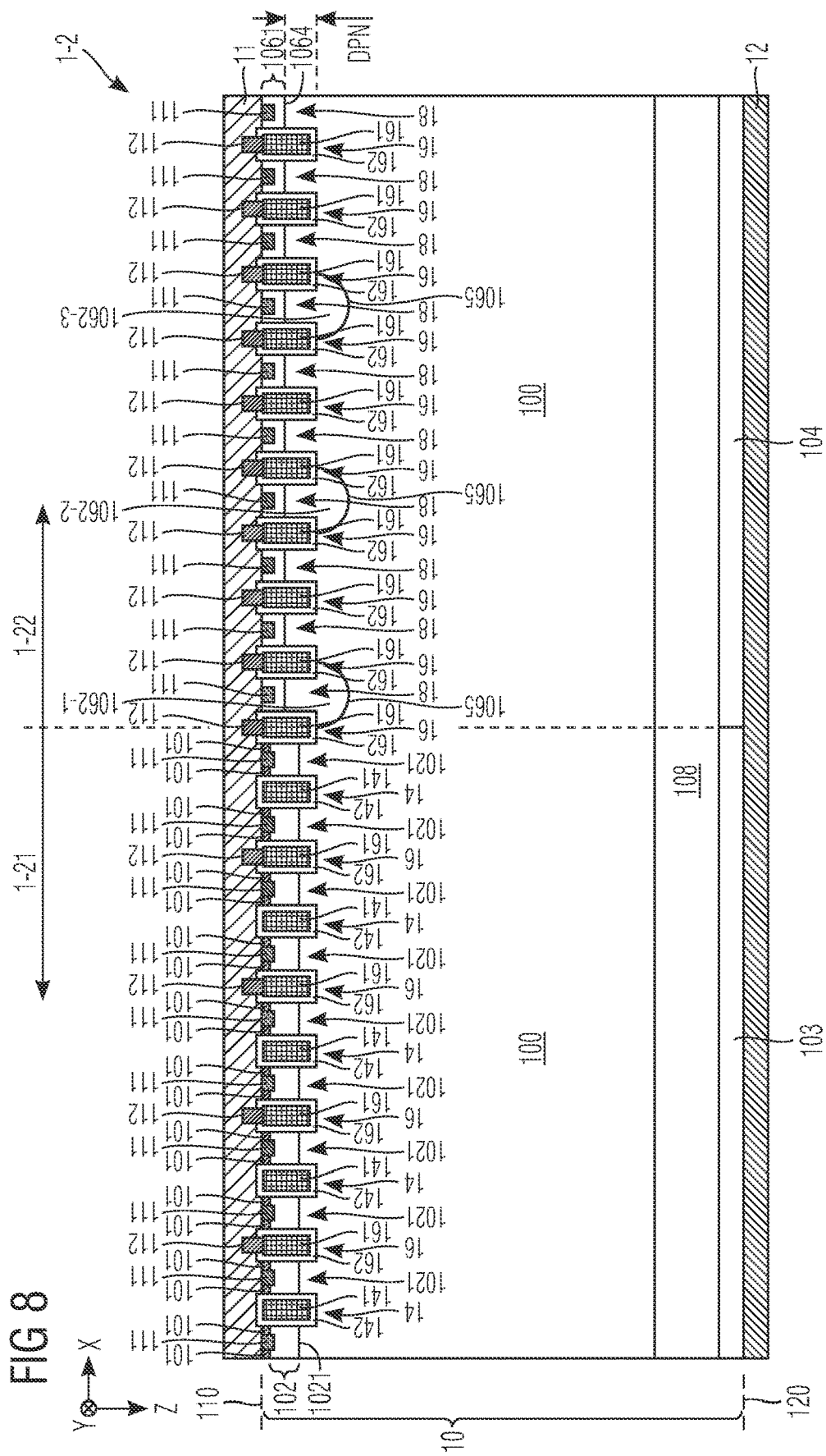

A variation of the embodiment of FIG. 6 is illustrated in FIG. 7. There, the anode subregions 1062-1 to 1062-3 are provided with a respective smaller first lateral extension (e.g., amounting to approximately 100% to 150% of the mesa width, e.g., such that only one respective diode mesa 18 is covered) and with a distance to each other amounting to approximately twice the first lateral extension.

Here, it is noted that a further pn-junction 1064 formed by a transition between the first anode region 1061 and the drift region 100 may be arranged substantially at the same vertical level as compared to pn-junction 1021 (i.e., above the trench bottoms), wherein the pn-junctions 1065 formed by the anode subregions 1062-1 to 1062-3 are arranged at a deeper level, e.g., below the trench bottoms. However, as illustrated by the difference between FIG. 7 and FIG. 8, the first anode regions 1061 in the diode section 1-22 may exhibit at least one of a lower dopant concentration and a lower dopant dose as compared to the body regions 102, which may be reflected by the further pn-junctions 1064 being arranged at a higher vertical level as compared to the vertical level of the pn-junctions 1021 in the IGBT section 1-21. For example, the distance DPN along the vertical direction Z between two pn-junctions 1021 and 1064 may be in the range of 0 µm to 2 µm Here, it shall further be noted that the second anode region 1062 or, respectively, each of its anode subregions 1062-1, . . . is electrically connected to the first load terminal 11.

Figure 9:
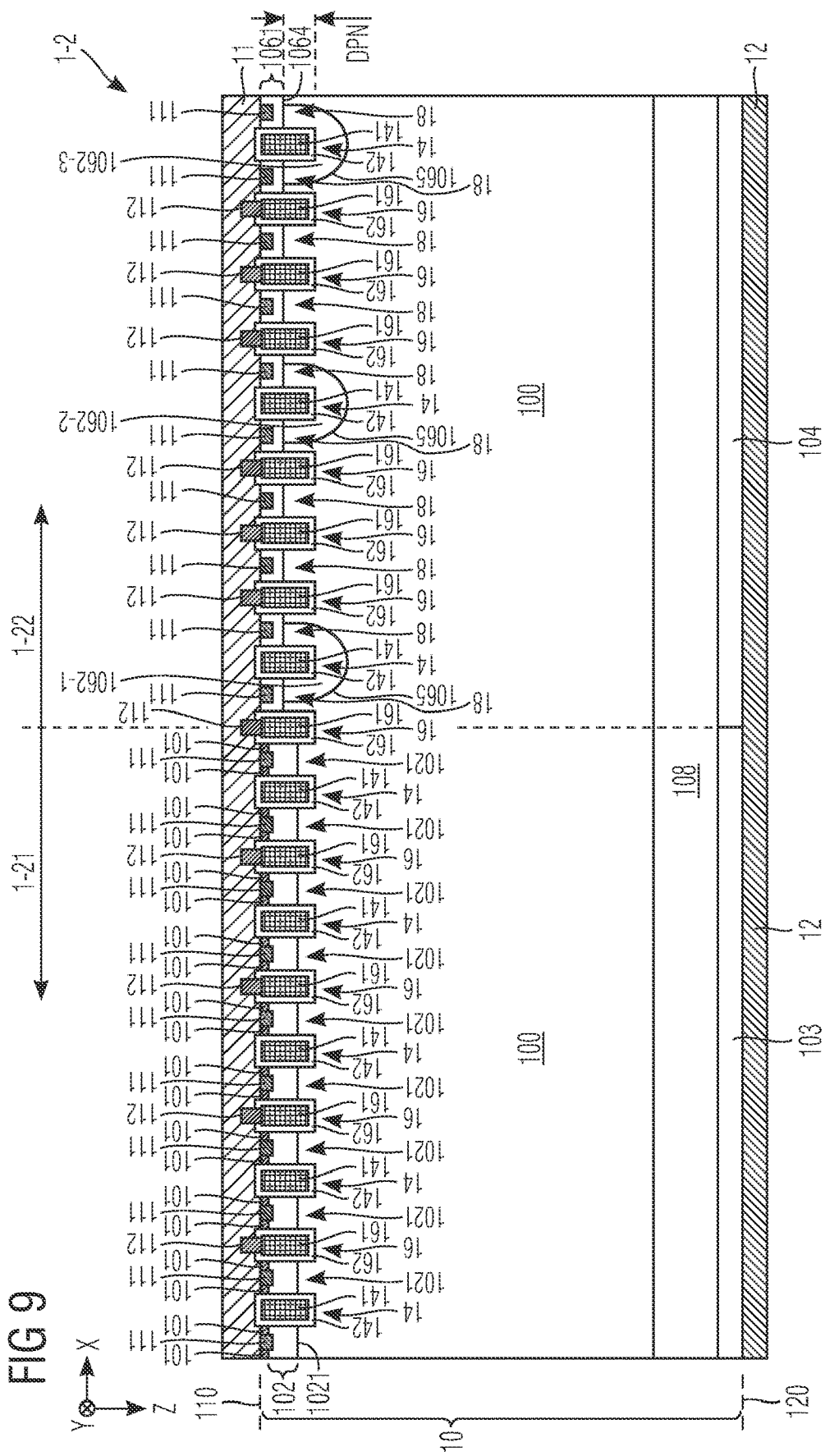

Now referring to FIG. 9, the diode section 1-22 may, in an embodiment, include some control trenches 14. In such case, each control trench 14 in the diode section 1-22 may be laterally flanked by two of the diode mesas 18. Furthermore, the anode subregions 1062-1, . . . may be arranged such that each of the anode subregions 1062-1, . . . overlaps with a respective one of the control trenches 14 and, at least partially, with the adjacent diode mesas 18 adjacent thereto, as illustrated in FIG. 9. Such structure can have the advantage that the control trenches 14 can be continued from the IGBT section 1-21 to the diode section 1-22 but do not (or almost not) influence the diode properties of the RC-IGBT 1. The density of the control trenches 14 in the diode section 1-22 may be the same as in the IGBT section 1-21 or different, e.g., smaller.

Figure 10:
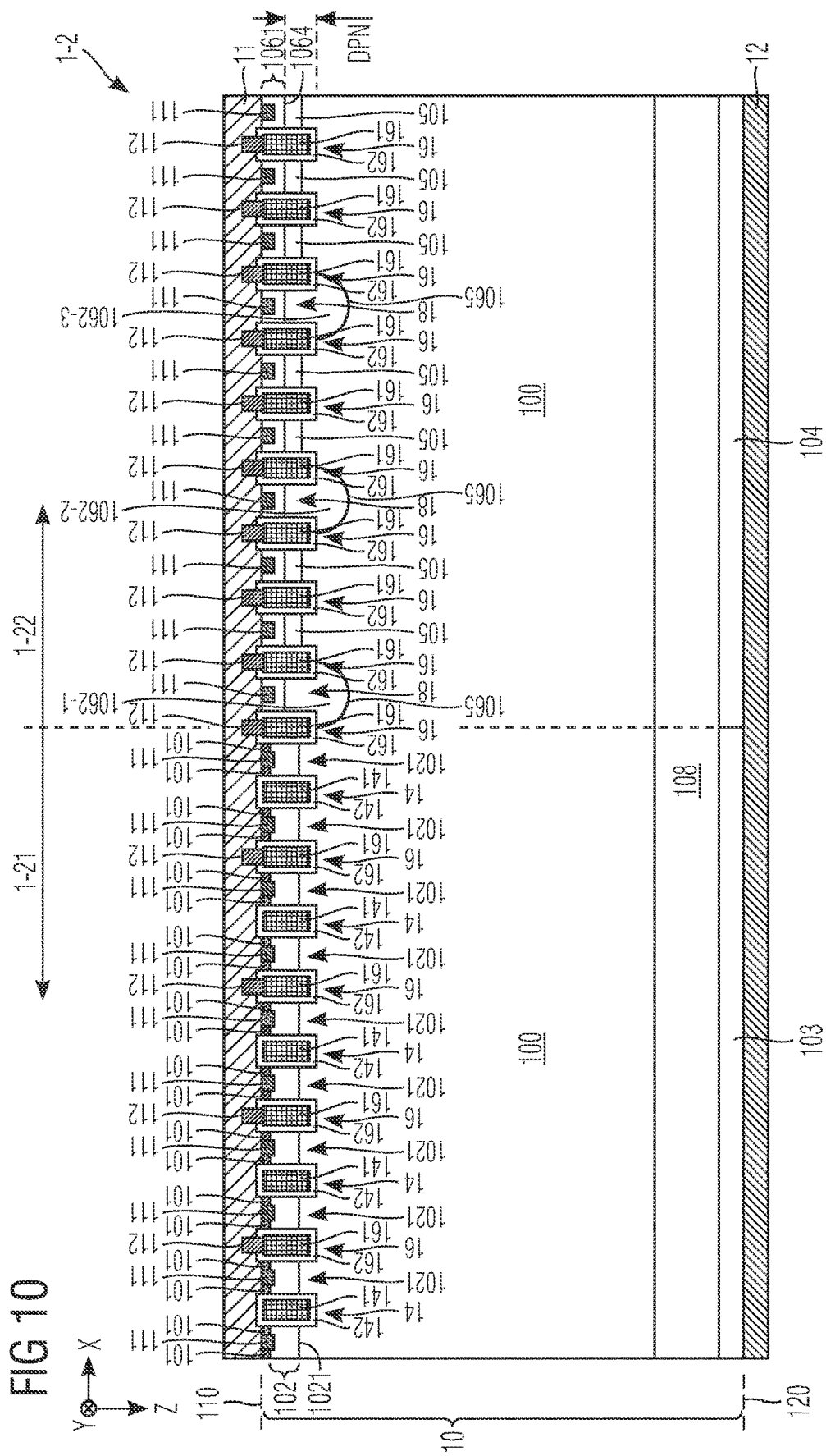

Referring to FIG. 10, in an embodiment, the RC IGBT 1 may further comprise, in each or some of the diode mesas 18 in the diode section 1-22 a barrier region 105 of the first conductivity type below and in contact with the first anode regions 1061 or below and displaced from first anode regions 1061 along the vertical direction Z. The barrier regions 105 may have a dopant concentration at least 100 times higher as compared to the dopant concentration of the drift region 100. For example, the barrier regions 105 are arranged such that they do not overlap with the second anode region 1062 or, respectively, with any of its anode subregions 1062-1, . . . . For example, the extension of each of the barrier regions 105 terminates along the vertical direction Z within the respective diode mesa 18; i.e., none of the barrier regions 105 extends further along the vertical direction Z than the trench bottoms. Accordingly, the first anode regions 1061 or a subset thereof may be coupled to the drift region 100 via a respective one of the barrier regions 105. Barrier regions 105 may also be implemented in one or more of the IGBT mesas 17 in the IGBT section 1-21.

The barrier regions 105 may allow for the reduction of the emitter efficiency of the first anode regions 1061 and thus for a reduction of the switching losses.

Instead of contact plugs 111, also planar contacts may be used to establish the electrical connection between the IGBT and diode mesas 17, 18 and the first load terminal 11.

Presented herein is also a method of producing an RC IGBT. In an embodiment, the method comprises: providing a semiconductor body having a first side and a second side; forming an active region with an IGBT section and a diode section; forming a first load terminal at the first side and a second load terminal at the second side; forming a plurality of control trenches and a plurality of source trenches, said pluralities of trenches being arranged in parallel to each other along a first lateral direction and extending into the semiconductor body along a vertical direction, wherein the plurality of source trenches extends into both the IGBT section and the diode section; forming a plurality of IGBT mesas and a plurality of diode mesas in the semiconductor body, said mesas being laterally confined, along the first lateral direction, by respective two of said pluralities of trenches. Each IGBT mesa comprises: a source region of a first conductivity type electrically connected to the first load terminal, and a body region of a second conductivity type electrically connected to the first load terminal and isolating the source region from another first conductivity type region of the RC IGBT. Each diode mesa comprises: a first anode region of the second conductivity type electrically connected to the first load terminal. The method further comprises: forming, in the semiconductor body and at the second side, both a diode emitter region of the first conductivity type that forms a part of the diode section and that exhibits a lateral extension in the first lateral direction amounting to at least 50% of the drift region thickness or to at least 50% of the semiconductor body thickness; and an IGBT emitter region of the second conductivity type that forms a part of the IGBT section and that exhibits a lateral extension in the first lateral direction amounting to at least 70% of the drift region thickness or to at least 70% of the semiconductor body thickness. The method further comprises forming, in the diode section, a second anode region of the second conductivity type electrically connected to the first load terminal.

The second anode region extends deeper along the vertical direction as compared to the trenches in the diode section. The second anode region overlaps with the diode emitter region for at least 5% of the horizontal area of the diode emitter region.

Embodiments of the RC IGBT production method correspond to the embodiments of the RC IGBT 1 presented above.

For example, forming the first anode regions 1061 and the second anode region 1062, or, respectively, its anode subregions 1062-1, . . . , may comprise carrying out at least one implantation processing step. The at least one implantation processing step may include a masked implantation processing step.

According to a first variant, a low energy implantation processing step (e.g., with an implantation energy in the range of 25 keV to 150 keV) is carried out. The implanted dopants can be subjected to a (e.g., deep) diffusion processing step in order to form the second anode region 1062, or, respectively, its anode subregions 1062-1, . . . . Subsequently, a further implantation processing step and/or a further diffusion processing step may be carried out to form the first anode regions 1061.

According to a second variant, a high energy implantation processing step (e.g., with an implantation energy greater than 300 keV or greater than 600 keV) is carried out, e.g., such that the implanted dopants gather at a rather deep vertical level, e.g., at a level corresponding to half of the trench depth. Thereby, carrying out a deep diffusion processing step may be omitted.

The dopant dose of the second anode region 1062, or, respectively, its anode subregions 1062-1, . . . may be within the range of $1*10^{12}$ cm$^{-2}$ to $1*10^{14}$ cm$^{-2}$ or within the range of $1*10^{12}$ cm$^{-2}$ to $2*10^{13}$ cm$^{-2}$, e.g., if the second variant (high energy implantation) is chosen. For example, in case of the second variant, the implantation dose for the high energy implantation processing step for forming the second anode region 1062 (or, respectively, its anode subregions 1062-1, . . . ) is within the range of 20% to 200% of the implantation dose chosen for forming the first anode region 1061.

The dopant dose of the second anode region 1062, or, respectively, its anode subregions 1062-1, . . . may be within the range of $1*10^{13}$ cm$^{-2}$ to $5*10^{14}$ cm$^{-2}$, e.g., if the first variant (low energy implantation and deep diffusion) is chosen. For example, in case of the first variant, the implantation dose for the low energy implantation processing step for forming the second anode region 1062 (or, respectively, its anode subregions 1062-1, . . . ) is greater than the implantation dose chosen for forming the first anode region 1061.

In the above, embodiments pertaining to an RC IGBT and corresponding processing methods were explained. For example, these RC IGBTs are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed. For example, the above described values of the dopant concentrations and dopant doses are related to embodiments where Si is chosen as the material of the semiconductor body 10.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

For example, for embodiments where SiC is chosen as the material of the semiconductor body 10, the above described values of the dopant concentrations and dopant doses may need to be adapted. For example, in case of SiC, the dopant concentrations are increased by a factor of ten or a factor of 100, and the dopant doses are increased by a factor between three and ten, compared to the values of the doses and concentrations described above.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An RC IGBT, comprising:
   an active region with an IGBT section and a diode section;
   a semiconductor body having a first side and a second side;
   a drift region formed in the semiconductor body;
   a first load terminal at the first side and a second load terminal at the second side;
   a plurality of control trenches and a plurality of source trenches arranged in parallel to each other along a first lateral direction and extending into the semiconductor body along a vertical direction, wherein the plurality of source trenches extends into both the IGBT section and the diode section, wherein each source trench includes a source trench electrode electrically connected to the first load terminal; and
   a plurality of IGBT mesas and a plurality of diode mesas in the semiconductor body and laterally confined, along the first lateral direction, by respective two of the pluralities of trenches,
   wherein each IGBT mesa comprises a source region of a first conductivity type electrically connected to the first load terminal, and a body region of a second conductivity type electrically connected to the first load terminal and isolating the source region from the drift region of the RC IGBT, wherein each control trench includes a control electrode configured to control a load current in an IGBT mesa arranged adjacent to the respective control trench, wherein each diode mesa comprises a first anode region of the second conductivity type electrically connected to the first load terminal, wherein in the semiconductor body and at the second side:
a diode emitter region of the first conductivity type forms a part of the diode section and exhibits a lateral extension in the first lateral direction amounting to at least 50% of the drift region thickness or to at least 50% of the semiconductor body thickness; and
an IGBT emitter region of the second conductivity type forms a part of the IGBT section and exhibits a lateral extension in the first lateral direction amounting to at least 70% of the drift region thickness or to at least 70% of the semiconductor body thickness, wherein in the diode section, a second anode region of the second conductivity type is electrically connected to the first load terminal, wherein the second anode region extends deeper along the vertical direction as compared to the trenches in the diode section, and overlaps with the diode emitter region for at least 5% of a horizontal area of the diode emitter region.

2. The RC IGBT of claim 1, wherein the second anode region overlaps with the diode emitter region for no more than 50% of the horizontal area of the diode emitter region.

3. The RC IGBT of claim 1, wherein the second anode region comprises two or more anode subregions spaced apart from each other along the first lateral direction and/or along a second lateral direction.

4. The RC IGBT of claim 3, wherein each of the two or more anode subregions exhibits a stripe configuration.

5. The RC IGBT of claim 4, wherein the respective stripe configuration extends in parallel to the diode mesas or perpendicular thereto.

6. The RC IGBT of claim 3, wherein each of the two or more anode subregions has a first lateral extension amounting to at least a width of one of the diode mesas in the first lateral direction, and a second lateral extension perpendicular thereto and amounting to at least twice the first lateral extension.

7. The RC IGBT of claim 6, wherein the anode subregions are arranged in parallel to each other, and wherein a minimum distance between each two of the two or more anode subregions in a direction in parallel to the respective first lateral extension amounts to at least the diode mesa width.

8. The RC IGBT of claim 1, wherein the second anode region overlaps for at least 10% of a horizontal interface area formed by the diode mesas in the diode section with a portion of the semiconductor body below thereof.

9. The RC IGBT of claim 1, further comprising, at least in each of some of the diode mesas in the diode section, a barrier region of the first conductivity type below the first anode regions and having a dopant concentration at least 100 times higher as compared to a dopant concentration of a drift region of the RC IGBT.

10. The RC IGBT of claim 9, wherein the barrier regions do not overlap with the second anode region.

11. The RC IGBT of claim 1, wherein an average dopant concentration of the second anode region is within the range of 50% to 1000% of an average dopant concentration of the first anode regions.

12. The RC IGBT of claim 1, wherein an average dopant concentration of the first anode regions is lower as compared to an average dopant concentration of the body regions.

13. The RC IGBT of claim 1, wherein the diode section does not comprise any IGBT mesa.

14. The RC IGBT of claim 1, wherein the diode section does not comprise any control trench.

15. The RC IGBT of claim 1, wherein each diode mesa is void of a first conductivity type region electrically connected to the first load terminal.

16. The RC IGBT of claim 1, wherein the diode section has a lateral extension along the first lateral direction amounting to at least the drift region thickness in the vertical direction or to at least the thickness of the semiconductor body in the vertical direction, and/or wherein the diode section has a lateral extension along the second lateral direction amounting to at least the drift region thickness or to at least the semiconductor body thickness.

17. A method of producing an RC IGBT, the method comprising:
providing a semiconductor body having a first side and a second side;
forming a drift region in the semiconductor body;
forming an active region with an IGBT section and a diode section;
forming a first load terminal at the first side and a second load terminal at the second side;
forming a plurality of control trenches and a plurality of source trenches arranged in parallel to each other along a first lateral direction and extending into the semiconductor body along a vertical direction, wherein the plurality of source trenches extends into both the IGBT section and the diode section, wherein each source trench includes a source trench electrode electrically connected to the first load terminal;
forming a plurality of IGBT mesas and a plurality of diode mesas in the semiconductor body and laterally confined, along the first lateral direction, by respective two of the pluralities of trenches, wherein each IGBT mesa comprises a source region of a first conductivity type electrically connected to the first load terminal and a body region of a second conductivity type electrically connected to the first load terminal and isolating the source region from the drift region of the RC IGBT, wherein each control trench includes a control electrode configured to control a load current in an IGBT mesa arranged adjacent to the respective control trench, wherein each diode mesa comprises a first anode region of the second conductivity type electrically connected to the first load terminal,
forming, in the semiconductor body and at the second side, both a diode emitter region of the first conductivity type that forms a part of the diode section and that exhibits a lateral extension in the first lateral direction amounting to at least 50% of the drift region thickness or to at least 50% of the semiconductor body thickness, and an IGBT emitter region of the second conductivity type that forms a part of the IGBT section and that exhibits a lateral extension in the first lateral direction amounting to at least 70% of the drift region thickness or to at least 70% of the semiconductor body thickness; and
forming, in the diode section, a second anode region of the second conductivity type electrically connected to the first load terminal,
wherein the second anode region extends deeper along the vertical direction as compared to the trenches in the diode section and overlaps with the diode emitter region for at least 5% of a horizontal area of the diode emitter region.

18. The method of claim 17, wherein forming the second anode region comprises carrying out an implantation processing step.

\* \* \* \* \*